United States Patent

Sakamoto et al.

Patent Number: 5,903,034
Date of Patent: May 11, 1999

[54] SEMICONDUCTOR CIRCUIT DEVICE HAVING AN INSULATED GATE TYPE TRANSISTOR

[75] Inventors: Kozo Sakamoto, Tokyo; Isao Yoshida, Hinode-machi, both of Japan

[73] Assignee: Hitachi, Ltd., Tokyo, Japan

[21] Appl. No.: 08/710,009

[22] Filed: Sep. 11, 1996

[30] Foreign Application Priority Data

Sep. 11, 1995 [JP] Japan .................................. 7-232397

[51] Int. Cl.$^6$ .......................... H01L 29/76; H01L 29/94; H01L 31/062; H01L 31/113
[52] U.S. Cl. .......................................... 257/379; 257/368
[58] Field of Search ...................... 257/368, 379

[56] References Cited

U.S. PATENT DOCUMENTS

| | | |
|---|---|---|
| 4,992,844 | 2/1991 | Yakushiji . |
| 5,581,103 | 12/1996 | Mizukami ................................ 257/355 |
| 5,629,546 | 5/1997 | Wu et al. ................................. 257/368 |

Primary Examiner—Ngân V. Ngâ
Attorney, Agent, or Firm—Antonelli, Terry, Stout & Kraus, LLP

[57] ABSTRACT

In a semiconductor circuit device having a substrate, a first region of a first conductivity type formed in the substrate, a second region of a second conductivity type contacted to the first region and a MISFET formed in the second region, there is a problem of that a parasitic npn bipolar transistor constituted by the first region, the second region and a source or drain of the MISFET activates. In this invention, switching circuitry is provided to make the second region floating or to connect the second region with the source or drain of the MISFET when a negative first input voltage is input to a source or a drain of the first MISFET. By virtue of the switching circuitry, no base current of the parasitic bipolar transistor occurs, thereby preventing operation of the parasitic transistor. In particular, when the switching circuitry operates to cause the second region to float, the base of the parasitic bipolar transistor will float, and the bipolar transistor cannot operate. Alternatively, when the switching circuitry connects the second region with the source or drain, the base-emitter junction of the parasitic bipolar transistor will be shorted, which also prevents its operation.

44 Claims, 4 Drawing Sheets

SEMICONDUCTOR CIRCUIT DEVICE HAVING AN INSULATED GATE TYPE TRANSISTOR

BACKGROUND OF THE INVENTION

The present invention relates to a semiconductor circuit device having an insulated gate semiconductor device. More particularly, the invention relates to a device having a power MOSFET, an IGBT (insulated gate bipolar transistor) or the like. More particularly, the invention relates to an insulated gate semiconductor device containing a control circuit such as a negative gate voltage protection circuit or an overheat protection circuit formed on the same chip.

Semiconductor circuit devices having large current capacities such as power MOSFETs are required in the fields of circuits, printers, hard disk drive, portable telephones, car electronics or the like. In these fields, semiconductor circuit devices are required which are immune from both overheating and negative gate voltages.

A conventional insulated gate semiconductor device containing a control circuit of this kind can be represented by, for example, a power MOSFET containing a control circuit such as an overheat protection circuit formed on the same chip to improve reliability as disclosed in, for example, Japanese Patent Laid-Open No. 7-58293. According to this reference, a gate resistor is connected between an external gate terminal and an internal gate terminal of the power MOSFET, and, in addition, a protection MOSFET for turning off the gate of the power MOSFET is connected between the internal gate terminal and an external source terminal. The gate resistor is for avoiding a short-circuit between the external gate terminal and the external source terminal when a positive voltage is applied to the external gate voltage. When the chip temperature rises beyond a predetermined temperature, therefore, the protection MOSFET is turned on to cause a gate current flow to the gate resistor to lower a potential of the gate of the power MOSFET, and the power MOSFET is turned off before the power MOSFET is broken.

According to this reference, the control circuit formed on the same chip is constituted by using an element having a self-isolation structure formed in the drain region of the power MOSFET in order to suppress an increase in the number of the processing steps. Therefore, though the cost can be suppressed, there arises a probability that a leakage current flows from the external drain terminal to the external gate terminal through a parasitic npn bipolar transistor that exists between the drain of the protection MOSFET and the drain of the power MOSFET when the gate voltage becomes negative. In order to cope with this, therefore, a cut-off diode for suppressing the base current of the parasitic npn bipolar transistor has heretofore been connected in series with the protection MOSFET, and, besides, a protect diode for preventing the above cut-off diode from being broken down has been connected between the external gate terminal and the external source terminal.

In order to operate the power MOSFET containing the overheat protection circuit at a high frequency, furthermore, Japanese Patent Laid-Open No. 6-244414 discloses an example of using a cut-off MOSFET instead of the above-mentioned gate resistor. The cut-off MOSFET is also for avoiding a short-circuit between the external gate terminal and the external source terminal when a positive voltage is applied to the external gate voltage. This reference employs the cut-off MOSFET whose body potential is fixed to the source terminal voltage. It is noted that here, and throughout the rest of this description, the term "body" means a region in which the MOSFET being referred to is formed.

SUMMARY OF THE INVENTION

According to Japanese Patent Laid-Open No. 7-58293, neither the source nor the drain of the protection MOSFET is connected to the source terminal of the power MOSFET. Therefore, when it is attempted to drive the device at a high frequency by using the cut-off MOSFET instead of the gate resistor, it cannot be avoided that the parasitic npn transistor which exists between the drain of the cut-off MOSFET and the drain of the power MOSFET is activated if the series circuit of the cut-off MOSFET and the cut-off diode, and the protect diode have certain characteristics.

Other problems are that the power MOSFET is not completely cut off due to a voltage drop in the cut-off diode, and that a minimum gate terminal voltage for the normal operating condition is raised by the forward voltage drop of the cut-off diode.

According to Japanese Patent Laid-Open No. 6-244414 which is intended to operate the device at a high frequency, there remains a problem in that when a cut-off MOSFET formed in the substrate is used instead of the gate resistor, the threshold value increases due to the substrate biasing effect, and the on-resistance of the cut-off MOSFET is not significantly lowered. Therefore, it is difficult to operate the device at high speeds. When a MOSFET formed in a polycrystalline silicon is used as the cut-off MOSFET, the mobility of carrier is lower than that of monocrystalline silicon. Therefore, the drivability of the power MOSFET becomes insufficient. Besides, the of the cut-off MOSFET is not significantly lowered so that it is difficult to drive the device at high frequencies.

It is therefore a first object of the present invention to provide a semiconductor circuit device having a negative gate voltage protection which prevents a parasitic npn (or pnp) bipolar transistor operation even when neither the source nor the drain of the cut-off MOSFET for the control circuit is connected to the source terminal of the power MOSFET.

A second object of the present invention is to provide a semiconductor circuit device containing a control circuit which is capable of reliably turning off the power MOSFET and of decreasing a minimum gate terminal voltage for normally operating the control circuit conventionally employed voltage.

A third object of the present invention is to provide a semiconductor circuit device containing a control circuit which controls the body potential as to avoid the substrate biasing effect of the cut-off MOSFET, and lowers the on-resistance, so that the device can be operated at high frequency.

A fourth object of the present invention is to provide a general semiconductor circuit device having a MISFET (metal-insulator-silicon type field effect transistor) whose source-drain path is capable of receiving a negative signal (e.g. the signal is a negative voltage relative to its body potential when the MISFET is n-channel type).

The above-mentioned objects are accomplished by a semiconductor circuit device as follows. The semiconductor circuit device has a drain terminal 60, a gate terminal 61 and a source terminal 62. Further, the semiconductor circuit device has, as shown in FIG. 1, a first insulated gate type transistor 29 with its drain being connected to the drain terminal 60 and its source being connected to the source terminal 62, a first MOSFET 33 whose source-drain path is provided between the gate 64 of the first insulated gate type transistor and the gate terminal 61, and a second MOSFET 34 with its body and source being connected to the body of the first MOSFET, its drain being connected to the gate terminal 61 and its gate being connected to the source terminal 62.

In the semiconductor circuit device, instead of the second MOSFET, there can be used a third MOSFET (MOSFET 41 in FIG. 1) with its body and source being connected to the body of the first MOSFET, its drain being connected to the source terminal and its gate being connected to the gate terminal, and/or by a first diode (diode 18 in FIG. 4) connected between the body of the first MOSFET and the source terminal. Of course, the semiconductor circuit device may be constituted by using both the second MOSFET 34 and the third MOSFET 41, as actually shown in FIG. 1.

According to another embodiment of the present invention, furthermore, the semiconductor circuit device can have, as shown in FIG. 5, a drain terminal 60, a gate terminal 61 and a source terminal 62, and comprise a first insulated gate type transistor 29 with its drain being connected to the drain terminal 60 and its source being connected to the source terminal 62, a first MOSFET 33 whose source-drain path is provided between the gate of the power MOSFET and the gate terminal 61, a third MOSFET 41 with its body and source being connected to the body of the first MOSFET 33, its drain being connected to the source terminal 62 and its gate being connected to the gate terminal 61, as well as at least a fourth MOSFET, i.e., a MOSFET 31 or a MOSFET 32, with its body and source being connected to the body of the third MOSFET 41 and its drain being connected to the gate of the first insulated gate type transistor 29. Or, as shown, for example, in FIG. 6, a first diode 18 may be used instead of the third MOSFET 41, and the body and source of the fourth MOSFET such as MOSFET 31 or MOSFET 32 may be connected to a node between the first diode and the first MOSFET.

In this case, furthermore, it is preferable to provide a second MOSFET 34 with its body and source being connected to the body of the first MOSFET 33, its drain being connected to the gate terminal 61 and its gate being connected to the source terminal 62.

Moreover, there may be provided a second insulated type transistor 30 with its gate being coupled to the gate of the first insulated gate type transistor 29, its drain being connected to the drain terminal 60 and its source being connected to the source terminal 62 through a resistance 57, and a fifth MOSFET, i.e., a MOSFET 36 of FIG. 3 with its body and source being connected to the source terminal 62, its drain being connected to the gate of the first MOSFET 33 and its gate being connected to a node between the source of the second insulated gate type transistor 30 and the resistance 57.

In this case, it is preferable to further provide a second diode 16 between the drain of the fifth MOSFET and the gate terminal 61 or the gate of the first insulated gate type transistor 29.

As shown in, for example, FIG. 7, there may be further provided a sixth MOSFET, e.g., MOSFET 37 or MOSFET 38 with its body being connected to the body of the third MOSFET 41, its drain being connected to the gate of the first insulated gate type transistor 29 and its source being connected to the source terminal 62.

In this case, it is further preferable to provide a third diode 11, 14 or 17 between the drain of the sixth MOSFET and the gate terminal 61.

As shown in, for example, FIG. 1, furthermore, it is preferable to provide a fourth diode 12 between the gate terminal 61 and the source terminal 62, or to provide the fourth diode 12 and a fifth diode 13 in series with, and in a reverse direction to, the fourth diode 12.

As shown in, for example, FIG. 1, it is further preferable to provide a first resistor 58 between the body of the first MOSFET 33 and the source terminal 62.

As shown in, for example, FIG. 1, furthermore, it is preferable that the first MOSFET 33 has its source connected to the gate 64 of the first insulated gate type transistor 29 and has its drain connected to the gate terminal 61. In this case, a sixth diode 15 and/or a second resistor 50 may be provided between the gate 64 of the first insulated gate type transistor 29 and the gate terminal 61, or a seventh MOSFET 48 may be provided with its gate and drain being connected to the gate 64 of the first insulated gate type transistor 29, its body being connected to the body of the first MOSFET 33 and its source being connected to the gate terminal 61.

As shown in, for example, FIG. 1, furthermore, it is preferable to provide a third resistor 51 and/or a seventh diode 14 in series between the gate of the first MOSFET 33 and the gate terminal 61, and to provide a capacitor 25 between the gate and the source of the first MOSFET 33.

It is further preferable that the first to third MOSFETs are of the depletion type.

According to the semiconductor circuit device of the present invention as shown in, for example, FIG. 2, it is preferable that a body region 104a of the first MOSFET 33 is isolated from a body region 107 of the power MOSFET 29 by a drain region 102 of the power MOSFET.

As shown in, for example, FIG. 8, furthermore, the semiconductor circuit device of the present invention contains a drain terminal 60, a gate terminal 61 and a source terminal 62, and can be constituted by at least a first insulated gate type transistor 29 with its gate being connected to the gate terminal 61, its drain being connected to the drain terminal 60 and its source being connected to the source terminal 62, a eighth MOSFET, i.e., MOSFET 43 or MOSFET 44, with its drain being connected to the gate terminal 61, and a second MOSFET 34 with its body and source being connected to the body of the eighth MOSFET, its drain being connected to the gate terminal 61 and its gate being connected to the source terminal 62.

In this case, the insulated gate semiconductor device may be constituted by using a third MOSFET 41 with its body and source being connected to the body of the eighth MOSFET, its drain being connected to the source terminal and its gate being connected to the gate terminal, and/or a first diode (diode 18 in FIG. 4) connected between the body of the eighth MOSFET and the source terminal, instead of using the second MOSFET, or may be constituted by using both the second MOSFET and the third MOSFET.

Even in this case, it is preferable that the body region of the eighth MOSFET is isolated from the body region of the power MOSFET by the drain region of the power MOSFET.

This invention can be used in a general semiconductor circuit device having a MISFET. In this case, as shown in FIGS. 1 and 2 for example, a semiconductor circuit device has a substrate, a first region 102 of a first conductivity type formed in the substrate, a second region 104a of a second conductivity type contacted to the first region and a first MISFET 33 formed in the second region, and further has a switching means 34 or 41. When a negative first input voltage is input to a source or a drain 109b of the first MISFET, the switching means 34 or 41 either cause the second region to float or connect the second region to the source or drain 109b. It is noted that if both switches 34 and 41 are used, they will operate in a complementary manner to either place the second region 104a in a floating state or in a connected state with the source or drain region 109b. In either the floating state or the connected state, the parasitic bipolar transistor operation is prevented. Specifically, when the second region 104a is floated, the base of the parasitic bipolar transistor will be floated, thereby preventing its operation. On the other hand, when the second region is connected to the source or drain region 109b, the base-emitter junction of the parasitic transistor is shorted, thereby preventing its operation.

In accordance with one embodiment, the switching means has a second MISFET 34 with its source or drain being connected to the source or drain of the first MISFET receiving the first input voltage, its body and drain or source being connected to the body of the first MISFET and its gate being connected to a first operating potential.

In accordance with one embodiment, the switching means has a third MISFET 41 with its gate being connected to the source or drain of the first MISFET receiving the first input voltage, its body and source or drain being connected to the body of the first MISFET and its drain or source being connected to a first operating potential 62. Of course, the switching means can have both the second and third MISFETs. In case the switching means has both the second and third MISFETs, a resistor 58 is preferable between both the MISFETs, as shown in FIG. 1. As noted previously, if both MISFETs 34 and 41 are provided, they will operate in a complementary manner to one another.

In accordance with one embodiment, the switching means has a diode 18 between a body of the first MISFET 33 and a first operating potential 62. Of course, the switching means can have both the second MISFET 34 and the diode. In case of that the switching means has both the second MISFET and the diode, a resistor 58 is preferable between both them.

In accordance with one embodiment, the first region 102 is connected to a second operating potential Vcc which prevents current flow at p-n contact between the second region 104a and the first region 102 when the second region is connected to the first operating potential 62(0V).

In the conventional semiconductor circuit device, the control circuit has been constituted by using, as a cut-off MOSFET or a protection MOSFET, a lateral MOSFET of the self-isolation structure formed in the drain region of the power MOSFET. When the lateral MOSFET is used as a first MOSFET for controlling the power MOSFET as in the reference, a parasitic npn transistor is turned on as the gate terminal assumes a negative potential. More specifically, the body of the first MOSFET serves as the base of the parasitic transistor, the source or drain of the first MOSFET serves as the emitter of the parasitic transistor, and the drain of the power MOSFET serving as the collector of the parasitic transistor. When this parasitic transistor operates, a current leaks from the external drain terminal to the external gate terminal of the semiconductor circuit device. On the other hand, according to the semiconductor circuit device of the present invention as shown in FIG. 1, provision is made of the second MOSFET 34 with its body and source being connected to the body of the first MOSFET 33 and its drain being connected to the gate terminal 61. When the gate terminal assumes a negative potential, therefore, the second MOSFET is turned on; i.e., the parasitic npn transistor that exists in the first MOSFET 33 is not forwardly biased across the emitter and the base, and is not turned on. Here, when the second MOSFET is of the depletion type, the negative gate voltage protection operates extremely quickly.

When the first diode 18 is provided between the body of the first MOSFET 33 and the source terminal, the first diode is forwardly biased when a positive voltage is applied to the gate terminal, and the body of the first MOSFET becomes nearly equal to the source potential. When a negative voltage is applied to the gate terminal, however, the first diode is reversely biased so that the body of the first MOSFET becomes floating, and no base current flows into the parasitic npn transistor that exists in the first MOSFET. Accordingly, the parasitic npn transistor is not turned on.

If desired, a third MOSFET 41 may be provided with its body and source being connected to the body of the first MOSFET 33, its drain being connected to the source terminal 62 and its gate being connected to the gate terminal 61. The third MOSFET 41 is turned on when a positive voltage is applied to the gate terminal so that the body 104a of the first MOSFET 33 assumes a source terminal voltage. However, in case a negative voltage is applied to the gate terminal, the third MOSFET 33 is turned off, and no base current flows into the parasitic npn transistor that exists in the first MOSFET. As described above, the third MOSFET 41 makes it possible to lower a minimum gate terminal voltage compared with that of the conventional negative gate voltage protection circuit using a cut-off diode as well as to increase the operation margin in the gate voltage. Furthermore, in case the third MOSFET 41 is of the depletion type, the body voltage of the first MOSFET 33 becomes equal to the source terminal voltage even when the gate terminal voltage is low, so that it is possible to further increase the operation margin in the gate voltage.

The parasitic npn transistor is prevented from operating more effectively when the second MOSFET 34 is used to prevent the parasitic npn transistor from being forwardly biased across its emitter and base, and when the third MOSFET 41 or the first diode 18 is used to block the base current to the parasitic npn transistor. The reason is as follows. When the second MOSFET 34 has a sufficiently high current driving ability, the second MOSFET 34 by itself works to effectively prevent the parasitic npn operation even when the gate terminal voltage drops quickly. However, when the gate voltage is close to 0 volt and the second MOSFET 34 is not sufficiently turned on, the parasitic npn transistor may not be effectively prevented from operating. On the other hand, when either the third MOSFET 41 or the first diode 18 is used even if without the second MOSFET 34, the parasitic npn transistor is effectively prevented from operating even when the gate voltage is close to 0 volt. However, when the gate voltage quickly drops, the parasitic npn transistor may be temporarily turned on. Thus, using both the second MOSFET 34 and either the third MOSFET 41 or the first diode 18 is more effective.

As for the MOSFET for the control circuit such as the MOSFET 33 shown in FIG. 3 of which neither the drain nor the source is connected to the source terminal, the above countermeasure is taken to prevent the parasitic npn transistor from operating. As for preventing the operation of the parasitic npn transistor that exists in the fifth MOSFET such as the MOSFET 36 for the control circuit used with its source being grounded, the second diode 16 may be connected in series therewith, and a fifth diode 13 having a breakdown voltage lower than that of the second diode 16 may be connected between the gate terminal 61 and the source terminal 62 to prevent the second diode from being broken down.

When the source of the first MOSFET 33 is connected to the gate of the power MOSFET 29 and the drain of the first MOSFET is connected to the gate terminal 61, as shown in FIG. 2, the body of the first MOSFET 33 is isolated from the body of the first insulated gate type transistor 29. When a positive voltage is applied to the gate terminal, therefore, the body potential of the first MOSFET can rise independently from the body of the first insulated gate type transistor 29, and the effect for biasing the substrate of the first MOSFET decreases. Accordingly, the effective on-resistance of the first MOSFET decreases, and the first insulated gate type transistor 29 can be turned on at high speeds.

In the case of the fifth MOSFET with its body and source being connected to the source terminal, i.e., in the case of the MOSFET 36 of FIG. 3 which is used for an overcurrent protection circuit, the second diode 16 is provided between the gate 64 of the first insulated gate type transistor 29 and the drain of the MOSFET 36, in order to prevent the parasitic npn transistor from operating when a negative gate voltage is applied to the gate terminal. If the drain of fifth MOSFET is connected to the gate terminal, the second diode is provided between the drain of the fifth MOSFET and the gate terminal 61.

Furthermore, the first resistor between the body of the first MOSFET and the source terminal causes the body potential of the first MOSFET to be elevated, and then the power MOSFET is turned on at high speed. In steady state, therefore, the body voltage drops down near to the source voltage, whereby the on-resistance of the first MOSFET does not vary and the first insulated gate type transistor 29 exhibits stable characteristics.

When the source of the first MOSFET 33 is connected to the gate 64 of the first insulated gate type transistor 29 and the drain of the first MOSFET 33 is connected to the gate terminal 61 as shown, for example, in FIG. 1, it is preferable to provide the sixth diode 15 connected between the gate 64 of the first insulated gate type transistor 29 and the gate terminal 61, or a seventh MOSFET 48 with its gate and drain being connected to the gate 64 of the first insulated gate type transistor 29, its body being connected to the body of the first MOSFET 33 and its source being connected to the gate terminal 61. This results in a rapid draining of electric carriers at the gate of the first insulated gate type transistor 29.

Furthermore, with a second resistor 50 being connected between the gate terminal 61 and the gate 64 of the first insulated gate type transistor 29, the gate voltage of when the first insulated gate type transistor 29 is turned on becomes equal to the gate terminal voltage. Thus, the second resistor 50 can decrease the on-resistance of the first insulated gate type transistor 29.

There may be further employed a bootstrap circuit constitution in which a seventh diode 14 and a third resistor 51 between the gate of the first MOSFET 33 and the gate terminal 61, and a capacitor 25 between the gate and the source of the first MOSFET are provided. In this case, the gate voltage of the first MOSFET increases, the on-resistance decreases, and the on-time of the first insulated gate type transistor 29 is improved.

A substrate bias is applied to the first MOSFET 33 so that its on-resistance increases. However, by employing a depletion-type MOSFET as the first MOSFET, the on-resistance can be decreased despite the substrate bias being applied, and the turn-on speed of the first insulated gate type transistor 29 can be increased.

Since the body region of the first MOSFET is isolated from the body region of the first insulated gate type transistor 29 using the drain region of the first insulated gate type transistor 29, the body potential of the first MOSFET can be controlled independently of the potential of the first insulated gate type transistor 29 so that the parasitic npn transistor will not be turned on with the body region of the first MOSFET as the base thereof.

Further, if the body potential of the first MOSFET is set to be higher than the source potential of the first insulated gate type transistor 29, it is allowed to suppress the effective on-resistance, which is caused by the substrate biasing, of the first MOSFET from increasing. The body regions can be isolated without requiring any additional process.

Moreover, when a negative gate voltage is applied to the gate terminal, the second MOSFET is turned on to prevent the operation of the parasitic npn transistor that exists even in the eighth MOSFET like in the first MOSFET because there is the second MOSFET 34 with its gate being connected to the source terminal 62 and its body and source being connected to the body of a depletion-type eighth MOSFET of which the gate and source are connected together and the drain is connected to the gate terminal 61 and is used for a circuit for controlling the power MOSFET, i.e., the body and source of the second MOSFET 34 being connected to the bodies of MOSFETs 43 to 45 constituting an active load in FIG. 8.

Furthermore, when the first diode is provided between the body of the eighth MOSFET and the source terminal, when the third MOSFET is provided with its body and source being connected to the body of the eighth MOSFET, its drain being connected to the source terminal and its gate being connected to the gate terminal, or when the second MOSFET and the third MOSFET are provided, the operation and effects are the same as those which take place when such elements are provided for by the first MOSFET.

Generally, this invention solves the problem that the parasitic bipolar transistor operates when a negative (reversed) signal is input to the source or drain of the protected power MISFET. This problem is solved by a switching means 34 or 41, when a first input voltage is input to a source or a drain of the first MISFET 33, for making the second region 104a floating or for connecting the second region 104a with the source or drain 109b to prevent a base current flow.

BRIEF DESCRIPTION OF THE DRAWINGS

The present invention will be more apparent from the following detailed description, when taken in conjunction with the accompanying drawings, in which.

DETAILED DESCRIPTION OF THE PREFERRED EMBODIMENT

Embodiments of the semiconductor circuit device according to the present invention will now be described in detail with reference to the accompanying drawings.

<Embodiment 1>

Figure 1:
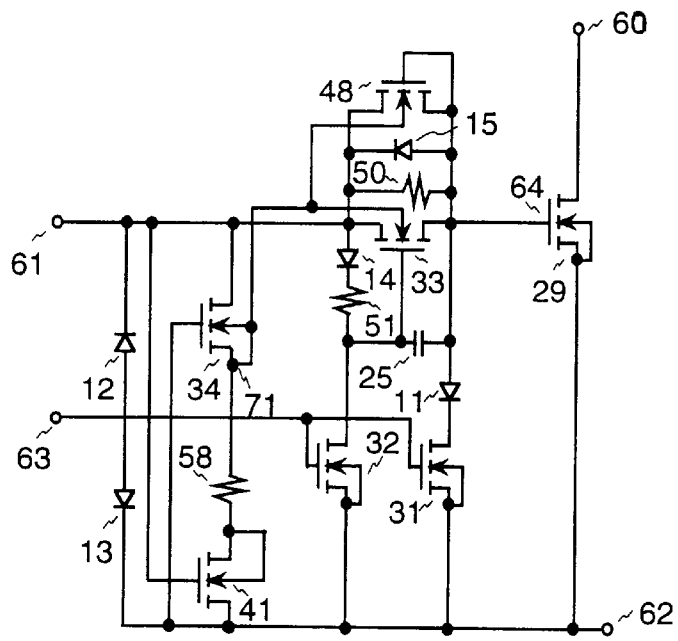
FIG. 1 is a circuit diagram illustrating the constitution of a semiconductor device according to a first embodiment of the present invention.
Figure 2:
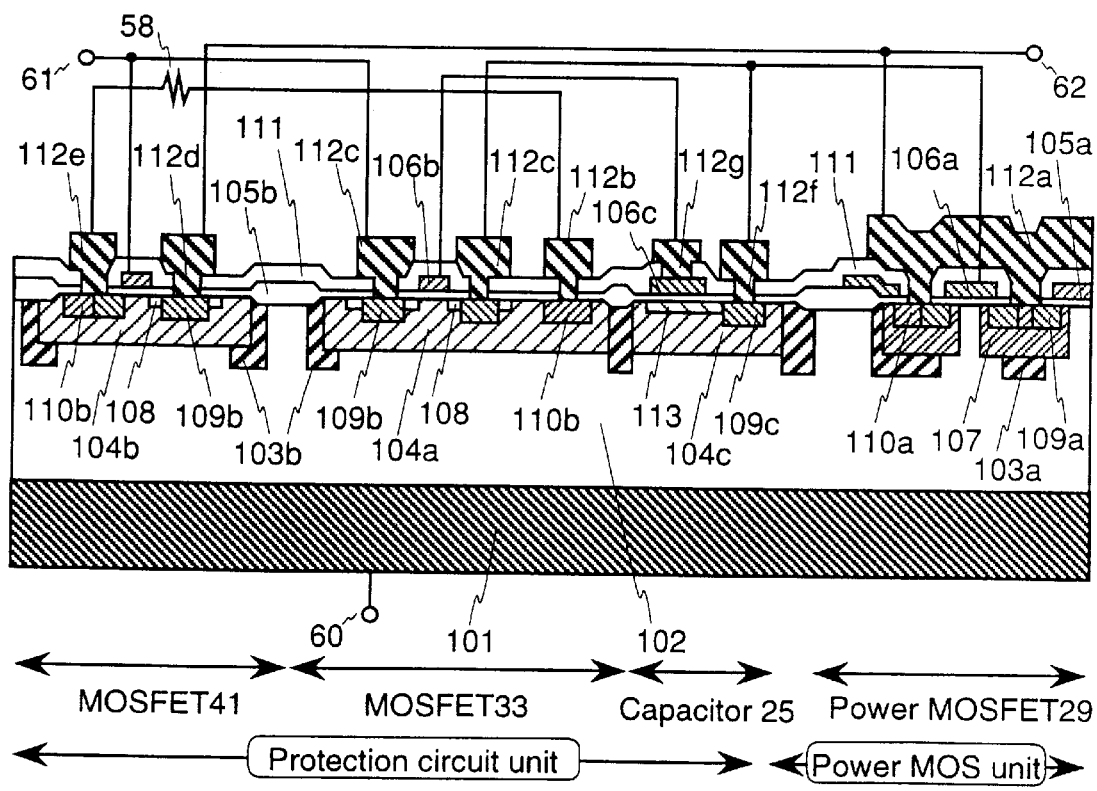
FIG. 2 is a sectional view illustrating the structure of major portions of the semiconductor device for realizing the circuit constitution of FIG. 1.

FIG. 1 is a circuit diagram illustrating the constitution of the semiconductor circuit device according to a first embodiment of the present invention. FIG. 2 is a diagram illustrating, in cross section, the structure of major portions of the semiconductor circuit device for realizing the circuit constitution shown in FIG. 1.

The semiconductor device of this embodiment having structure shown in FIG. 2 can be formed by the same process as the one for producing the conventional vertical-type power MOSFETs. In FIG. 2, reference numeral 101 denotes a high-density n-type semiconductor substrate containing antimony or arsenic as impurities and having a resistivity of about 0.02Ω cm to about 0.002Ω cm. On the n-type semiconductor substrate 101 is formed an n-type epitaxial layer 102 having a resistivity of about 1 to 2Ω cm maintaining a thickness of about 10 $\mu$m.

In a portion where the power MOSFET is formed and among the patterns of a polycrystalline silicon gate layer 106a formed on a gate oxide film 105a of about 50 nm, there are formed a first p-type well diffusion layer 103a having a depth of 6 $\mu$m and a dosage of about $1 \times 10^{15}$ cm$^{-2}$, a p-type diffusion layer 107 for the body having a depth of 2 $\mu$m and a dosage of about $5 \times 10^{13}$ cm$^{-2}$ that is formed in a self-aligned manner using the polycrystalline silicon gate layer 106a as a mask, and an n-type diffusion layer 109a for the source having a depth of 0.4 $\mu$m and a dosage of about $1 \times 10^{16}$ cm$^{-2}$. In order to make an ohmic contact between a body 107 and an aluminum electrode 112a, furthermore, there is formed a high-density p-type diffusion layer 110a having a depth of 0.5 $\mu$m and a dosage of about $1 \times 10^{15}$ cm$^{-2}$. On the polycrystalline silicon gate layer 106a is formed, via an insulating layer 111, an aluminum electrode layer 112a that serves as a source electrode.

In the protection circuit unit, furthermore, there are formed second p-type well diffusion layers 104a and 104b having a depth of 5 $\mu$m and a dosage of about $2 \times 10^{13}$ cm$^{-2}$ as bodies, high-density n-type diffusion layers 109b formed at the same step as the n-type diffusion layer 109a to serve as a drain diffusion layer and a source diffusion layer, a high-density p-type diffusion layer 110b formed at the same step as the high-density p-type diffusion layer 110a as a high-density p-type diffusion layer for creating the ohmic contact between the bodies 104a, 104b and the aluminum electrodes 112b to 112e, a polycrystalline silicon gate 106b formed at the same step as the polycrystalline silicon gate layer 106a as a gate electrode for a MOSFET for a protection circuit, and a low-density n-type region 108 as a low-density n-type offset region having a dosage of about $5 \times 10^{12}$ cm$^{-2}$ for increasing the drain breakdown voltage.

As for the capacitor 25 of FIG. 1 of which the two electrodes undergo a change depending upon the potential of the source terminal 62, one electrode connected to the gate of MOSFET 33 is constituted by a polycrystalline silicon gate layer 106c formed at the same step as the polycrystalline silicon gate layer 106a, and the other electrode connected to the gate 64 of power MOSFET 29 is constituted by an n-type diffusion layer 113 formed by implanting arsenic or phosphorus ions in a dosage of about $1 \times 10^{15}$ cm$^{-2}$ prior to the step of forming the polycrystalline silicon gate layer 106c. Reference numeral 105b denotes a field oxide film, and 112g and 112f denote aluminum electrodes.

Source-grounded or drain-grounded MOSFETs 31 and 41, and a MOSFET 33 of which neither the drain nor the source is grounded, which are MOSFETs for the control circuit shown in FIG. 1, are formed in the n-type epitaxial layer 102 which is the drain region of the power MOSFET (FIG. 2 which is a sectional view illustrating the structure of major portions, illustrates portions of MOSFETs 41, 33, capacitor 25 and power MOSFET 29). Like the conventional process for fabricating power MOSFETs, therefore, the control circuit can be contained at a low cost. However, a problem is created in that there exists a parasitic npn transistor that is constituted with the drain region 102 of power MOSFET as the collector, drain-source region 109b of MOSFET 31 or MOSFET 33 which is the MOSFET for the control circuit as the emitter, and the body regions 104a, 104b of MOSFET 31 or MOSFET 33 which is the MOSFET for the control circuit as the base. This problem, however, is solved by the semiconductor circuit device of this embodiment employing a circuit constitution that is shown in FIG. 1.

In FIG. 1, reference numeral 60 denotes a drain terminal, 61 denotes a gate terminal, 62 denotes a source terminal and 63 denotes a cut-off terminal. The turn-off terminal 63 is the one for forcibly turning off the power MOSFET 29 even when a positive voltage is applied to the gate terminal 61. In the case of FIG. 1, the power MOSFET 29 can be forcibly turned off when the input voltage of the turn-off terminal 63 is higher than the threshold voltage of MOSFETs 31 and 32.

The MOSFET 32 of which the drain is connected to the gate of MOSFET 33 and of which the source is connected to the source terminal 62 of power MOSFET 29, is usually being turned off but is turned on when a turn-off voltage is applied to the turn-off terminal 63. When the power MOSFET 29 is to be turned on, the MOSFET 32 which is being turned off. Thus, the voltage at the gate terminal 61 is applied to the gate of the MOSFET 33 via a series circuit of diode 14 and resistor 51. Accordingly, the on-resistance of the MOSFET 33 is lowered to accomplish switching operation at high speeds. When the power MOSFET 29 is to be forcibly turned off by the turn-off terminal 63, the MOSFET 32 is turned on and the gate of MOSFET 33 is lowered down to the voltage of the source terminal 62. Accordingly, the on-resistance of the MOSFET 33 increases, and the power MOSFET 29 is turned off even if the MOSFET 31 has a small driving ability.

In this embodiment, the MOSFET 34 is connected at its drain to the gate terminal 61, connected at its source and body to the body of the MOSFET 33, and connected at its gate to the source terminal 62. The MOSFET 41 is connected at its drain to the source terminal 62, connected at its source and body to the body of the MOSFET 33 via a resistor 58, and connected at its gate to the gate terminal 61. To the source-grounded MOSFET 31 is connected the diode 11 in a manner to be inserted in series between the gate 64 of power MOSFET 29 and the source terminal 62. To the source-grounded MOSFET 32 is connected the diode 14 in a manner to be inserted in series between the gate terminal 61 and the source terminal 62. Moreover, the diode 12 and the diode 13 connected in series but in the opposite directions with each other are connected between the gate terminal 61 and the source terminal 62. The MOSFET 33 is connected at its drain to the gate terminal 61 and connected at its source to the gate 64 of power MOSFET 29. A series circuit of diode 14 and resistor 51 is connected between the drain and the gate of MOSFET 33, and the capacitor 25 is connected between the gate and the source of MOSFET 33. The resistor 58 may be omitted. Here, however, the resistor 58 contributes to raising the body potential of MOSFET 33 enabling the power MOSFET to be turned on at high speeds. In a steady state, the body potential drops down to near the source voltage and, hence, the on-resistance of MOSFET 33 does not change giving advantage from the standpoint of stabilizing characteristics of the power MOSFET.

According to the semiconductor device of this embodiment constituted as described above, as will be obvious from FIG. 2 which is the sectional view illustrating the structure, there exists a parasitic npn transistor constituted with the drains of the source-grounded MOSFETs 31, 32 as the emitter, the bodies thereof as the base and the drain of the power MOSFET 29 as the collector. This embodiment inhibits the operation of the parasitic npn transistor by cutting off the base current to the parasitic npn transistor with diodes 11, 14 in the same manner as the conventional constitution of the negative gate voltage protection circuit disclosed in Japanese Patent Laid-Open No. 6-58293. Further, this embodiment prevents the diodes 11, 14 from being broken down when the gate terminal 61 assumes a negative potential by setting the resultant breakdown voltage of the diodes 12 and 13 that are connected in series but in the opposite directions with each other to be lower than the breakdown voltage of the diodes 11 and 14.

However, between the power MOSFET 29 and the MOSFET 33 for the control circuit with its drain being connected to the gate terminal 61 and its source being connected to the gate 64 of power MOSFET, there exists a parasitic npn transistor that is constituted with the drain of MOSFET 33 as the emitter, the body of MOSFET 33 as the base and the drain terminal 60 of power MOSFET 29 as the collector. The parasitic npn transistor stemming from the MOSFET of which neither the source nor the drain is connected to the source terminal 62, cannot be prevented from bipolar operating by the above-mentioned conventional negative gate voltage protection circuit.

According to this embodiment, therefore, the parasitic npn transistor is prevented from the bipolar operating in a manner as described below by using the MOSFET 34. When the negative gate voltage is applied to the gate terminal 61, the MOSFET 34 is turned on whereby the drain (i.e., emitter of the parasitic npn transistor) of MOSFET 34 is connected to the body (i.e., base of the parasitic npn transistor) of MOSFET 33 via a node 71 at which the source and body of MOSFET 34 are connected together. Therefore, the diode is short-circuited across the emitter and the base of parasitic npn transistor and, hence, the parasitic npn transistor is prevented from operating. Moreover, the MOSFET 41 operates as described below. When the voltage at the gate terminal 61 is positive, the MOSFET 41 is turned on so that the body of the MOSFET 33 is connected to the source terminal 62 to assume the source terminal voltage. When the gate terminal 61 assumes the negative voltage, the MOSFET 41 is turned off to cut off the base current to the parasitic npn transistor that exists in the MOSFET 33; i.e., the parasitic npn transistor is prevented from operating. Thus, the leakage of current from the drain terminal 60 to the gate terminal 61 is prevented. The leakage current, otherwise, is caused by the operation of the parasitic npn transistor.

The breakdown voltage of the parasitic npn transistor is lower than the breakdown voltage of the power MOSFET. Therefore, when the negative gate voltage is applied to the gate terminal 61 and a high voltage is applied to the drain terminal 60, a breakdown current concentrates into the parasitic npn transistor so that the element may be broken down. The circuit of this embodiment using the diodes 11, 14 and MOSFETs 34, 41, can prevent the element from the breakdown because the parasitic npn transistor almost short-circuits the passage between the base and the emitter to exhibit a breakdown voltage higher than the base-open breakdown voltage $BV_{CEO}$, i.e., to exhibit a breakdown voltage which is almost equal to the collector-base breakdown voltage $BV_{CBO}$.

In order to prevent the operation of the npn transistor in the MOSFET 33 for the control circuit, there may be used MOSFET 34 only or MOSFET 41 only. In this embodiment, however, both MOSFET 34 and MOSFET 41 are used to enhance the effect of negative gate voltage protection. This is because, if the MOSFET 34 has a high current driving ability, the MOSFET 34 is capable of preventing the parasitic npn transistor from operating even when the gate terminal voltage drops at a high speed. However, when the gate terminal voltage is close to 0 volt, the MOSFET 34 is not turned on to a sufficient degree to prevent the parasitic npn transistor from operating. On the other hand, when only the MOSFET 41 is used, the parasitic npn transistor is prevented from operating even when the gate terminal voltage is close to 0 volt. However, when the gate voltage drops rapidly, the parasitic npn transistor may be turned on temporarily. Thus, using both MOSFETs 34 and 41 is preferable. If the MOSFET 34 is of the depletion type, there is an improved current driving ability, when a negative gate voltage is applied to the gate terminal 61, contributing to enhancing the effect for preventing the operation of the parasitic npn transistor.

In the circuit of this embodiment, furthermore, when the voltage is applied to the gate terminal 61, the body potential of the MOSFET 33 rises being affected by parasitic capacity. Therefore, the substrate biasing effect of the MOSFET 33 decreases. Accordingly, the effective on-resistance of the MOSFET 33 decreases, and the power MOSFET 29 is turned on at a high speed. After the gate terminal voltage has acquired a high constant potential, the body potential of the MOSFET 33 drops to the voltage of the source terminal 62 with a time constant determined by the resistor 58 and parasitic capacitance. Here, the turn-on speed of the power MOSFET 29 increases with an increase in the value of the resistor 58. However, when the voltage at the drain terminal 60 drops, an extended period of time is required for emitting minority carriers that are injected from the body region of the MOSFET 33 into the drain region of the power MOSFET. This causes the turn-off time of the power MOSFET to be lengthened. Therefore, the value of the resistor 58 is optimized to avoid this problem. Similar effects can be obtained even when the resistor 58 is short-circuited to increase the on-resistance of the MOSFET 41 or even when the threshold voltage is increased.

The MOSFET 33 exhibits an increased on-resistance due to the substrate biasing. However, the MOSFET 33 of the depletion type exhibits a small on-resistance despite the application of the substrate bias. Therefore, The MOSFET 33 of the depletion type allows to increase the turn-on speed of the power MOSFET 29.

In the circuit of this embodiment, furthermore, when a positive voltage is applied to the gate terminal 61, the gate of MOSFET 33 is electrically charged via diode 14 and resistor 51 so that the power MOSFET 33 is turned on. Besides, the capacitor 25 is electrically charged. When the voltage at the gate 64 of power MOSFET rises, therefore, the diode 14 and the capacitor 25 work as a bootstrap circuit to boost the voltage at the gate of MOSFET 33. Accordingly, the gate voltage of the MOSFET 33 increases in compare with when there is neither the diode 14 nor the capacitor 25, and the MOSFET 33 exhibits a low on-resistance enabling the power MOSFET 29 to be turned on at a high speed.

When there is added a MOSFET 48 with its gate and drain being connected to the gate 64 of power MOSFET, its source being connected to the gate terminal 61 and its body being connected to the body of MOSFET 33, the electric charge is quickly extracted from the gate 64 of power MOSFET. This enables the power MOSFET 29 be turned off at a high speed. Even when the diode 15 is added to between the gate terminal 61 and the gate 64 of power MOSFET, the power MOSFET 29 can be turned off at a higher speed than when only the resistor 50 is used.

In this embodiment, furthermore, the potential at the gate 64 of power MOSFET is lower than the potential at the gate terminal 61. However, the resistor 50 transfers the voltage same as that of the gate terminal 61 to the gate 64 of power MOSFET at the DC level. Thus, the on-resistance of power MOSFET 29 can be sufficiently lowered.

As shown in FIG. 2 which is a sectional view illustrating the structure of major portions, the feature of the semiconductor circuit device of this embodiment resides in that the body region of the vertical-type power MOSFET 29 is isolated from the body region of the lateral MOSFET 33 for the control circuit by the drain region of power MOSFET 29. Since the body regions are isolated, as described above, the body potential of MOSFET 33 becomes higher than the source potential of power MOSFET when a positive gate voltage is applied to the gate terminal 61. Therefore the on-resistance of MOSFET 33 connected between the gate terminal 61 and the gate 64 of power MOSFET decreases and the power MOSFET 29 can be switched at a high speed.

In the case of this embodiment, furthermore, the MOSFET 41 and the MOSFET 33 are isolated from each other by the drain region of power MOSFET 29. As shown in the circuit of FIG. 1, therefore, the body potential of MOSFET 33 is isolated from the body potential of MOSFET 41 by the resistor 58.

As for the capacitor 25 of FIG. 1 of which the two electrodes both undergo a change in response to the potential at the source terminal 62, furthermore, one electrode connected to the gate of MOSFET 33 is constituted by the polycrystalline silicon gate layer 106c formed at the same step as the polycrystalline silicon gate layer 106a, and the other electrode connected to the gate 64 of power MOSFET is constituted by the n-type diffusion layer 113. The n-type diffusion layer 113 is isolated from the n-type epitaxial layer 102 that works as the drain of power MOSFET 29. In order to accomplish negative gate voltage protection, furthermore, a p-type diffusion layer 104c of which the potential varies at all times together with the body of MOSFET 33 is used for isolating the n-type diffusion layer 113.

In the case of the circuit of FIG. 1, the bodies of MOSFETs 33 and 34 are directly connected together so that the bodies can be formed in one body region (p-type diffusion layer 104a). The MOSFETs 31 and 32 are formed in a p-type diffusion layer connected to the body region of power MOSFET 29. The layer, in which the MOSFETs 31 and 32 are formed, is formed in the same step as the second p-type well diffusion layers 104a, 104b of the MOSFETs 33, 41. Such an isolation structure can be realized without adding any step to the conventional process for fabricating power MOSFET and, hence, at a low cost.

Around the MOSFETs 33 and 41 is formed a high-density p-type diffusion layer 103b that has a surface density higher than that of the second p-type well diffusion layers 104a, 104b for the protection circuit. The layer 103b is formed at the same step as the first p-type well diffusion layer 103a. The layer 103b prevents the formation of channel among the MOSFETs in the protection circuit unit or between a MOSFET in the protection circuit unit and a drain region of power MOSFET. The resistors and diodes used in this embodiment are so designed by a polycrystalline silicon layer that parasitic elements will not be formed just in the same manner as the one disclosed in the reference of Japanese Patent Laid-Open No. 6-58293.

<Embodiment 2>

Figure 3:
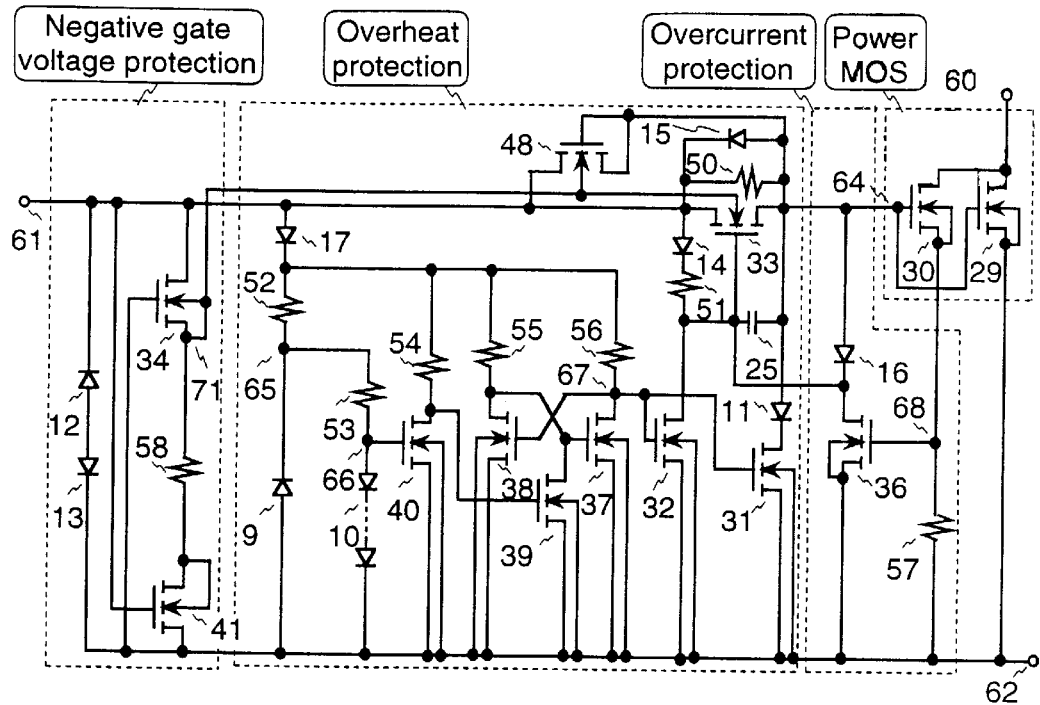
FIG. 3 is a circuit diagram illustrating the constitution of the semiconductor device according to a second embodiment of the present invention.

FIG. 3 is a circuit diagram illustrating the constitution of the semiconductor circuit device according to a second embodiment of the present invention. In FIG. 3, the same constituent portions as those of the embodiment 1 shown in FIG. 1 are denoted by the same reference numerals and their description is not repeated.

In this embodiment, the MOSFETs 31 and 32 are not controlled by the external terminal 63 like in the embodiment 1, but are controlled by an internal circuit which limits or cuts-off the drain current of power MOSFET 29 when the temperature in the semiconductor chip has raised beyond a predetermined value or when the drain current has exceeded a predetermined value. This is a difference from the embodiment 1. The MOSFET 33, a series circuit of diode 14 and resistor 51 provided between the drain and the gate of MOSFET 33, capacitor 25 provided between the source and the gate of MOSFET 33 and power MOSFET 29 act the same as the embodiment 1. Constitution of the negative gate voltage protection circuit for preventing the operation of the parasitic npn transistor when the gate terminal 61 becomes lower than the source terminal 62, as well as the actions and effects thereof mentioned with reference to FIG. 1, are nearly the same as the constitutions, actions and effects obtained by the embodiment 1.

In FIG. 3, a diode 9 and a resistor 52 constitute a constant-voltage circuit and generate a constant voltage at a node 65. A diode 17 prevents the operation of parasitic npn transistors that exist in the MOSFETs 37 to 40 when the gate terminal 61 assumes a negative voltage, and plays the same role as the diode 11 for the MOSFET 31.

A diode train 10, resistors 53, 54 and a MOSFET 40 constitute a temperature detecting circuit. When the voltage in the forward direction of the diode train 10 decreases with an increase in the temperature of the chip, the voltage at a gate 66 of MOSFET 40 decreases. As the voltage at the gate 66 becomes lower than the threshold voltage of MOSFET 40, the MOSFET 40 is turned off causing the input voltage of the latch circuit constituted by resistors 55, 56 and MOSFETs 37 to 39 to increase. At normal temperature, the MOSFET 37 in the latch circuit is turned on and the MOSFETs 38 and 39 is turned off. However, as the chip temperature rises beyond the predetermined value and as the input voltage of the latch circuit increases, the MOSFETs 38 and 39 are turned on, the MOSFET 37 is turned off, and the voltage increases at the node 67 which works in the same manner as the turn-off terminal 63 of FIG. 1. Therefore, the power MOSFET 29 is turned off.

The power MOSFET unit is constituted by MOSFETs 29 and 30. A cell ratio of MOSFETs 29 and 30 is, for example, 1000 to 1 so that about 1/1000 of the drain current of the power MOSFET 29 flows through the MOSFET 30. The resistor 57 and the MOSFET 36 constitute an overcurrent protection circuit. As the drain current of MOSFET 30 increases, the voltage increases at the gate 68 of MOSFET 36. The MOSFET 36 starts being turned on as the drain current becomes larger than the predetermined value. Therefore, the resistance between the drain and the source of MOSFET 33 increases, and the voltage at the gate 64 of power MOSFETs 29 and 30 drops, so that the drain current of the power MOSFET converges within a predetermined current value range. The diode 16 is provided to prevent the operation of the parasitic npn transistor that exists in the MOSFET 36 when the gate terminal 61 assumes a negative gate voltage, and plays the same role as the diode 11 for the MOSFET 31.

The semiconductor device according to this embodiment has the cross-sectional structure which is nearly the same as that of the embodiment 1 shown in FIG. 2. That is, the structure is substantially quite the same except that the MOSFETs 37 to 40 can be formed in a p-type diffusion layer connected to the body region of the power MOSFET like the MOSFET 31 or 32, since the body potential of MOSFETs 37 to 40 is equal to the body potential of power MOSFET 29.

<Embodiment 3>

Figure 4:
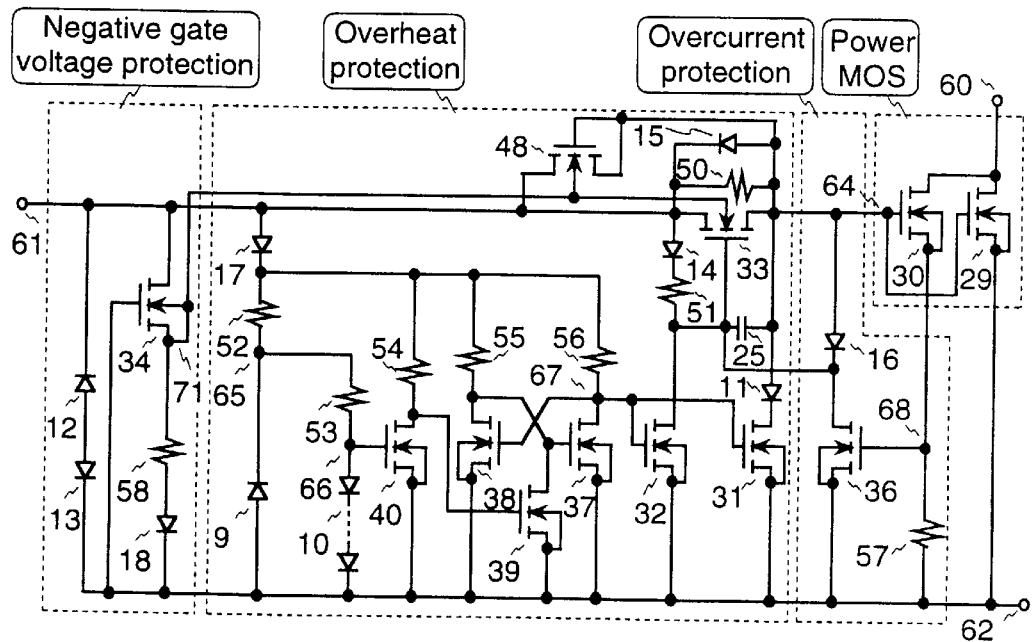
FIG. 4 is a circuit diagram illustrating the constitution of the semiconductor device according to a third embodiment of the present invention.

FIG. 4 is a circuit diagram illustrating the constitution of the semiconductor circuit device according to a third embodiment of the present invention. For the sake of explanation, here, the same constituent portions as those of the embodiment 2 shown in FIG. 3 are denoted by the same reference numerals and their description is not repeated.

This embodiment is different from the embodiment 2 with respect to that a diode 18 is used instead of the MOSFET 41 to provide negative gate voltage protection. Therefore, a minimum body potential of MOSFET 33 does not become zero volt but remains at about 0.5 V. In other respects, the constitution is quite the same as the constitution shown in FIG. 3. Therefore, the circuit constitution for driving the power MOSFET 29 at a high frequency and the circuit constitution of negative gate voltage protection for preventing the operation of parasitic npn transistor of when the potential at the gate terminal 61 becomes lower than that of the source terminal 62, are the same as those of the embodiments 1 and 2 described with reference to FIGS. 1 and 3, and the obtained effects are the same, too.

The cross-sectional structure of the semiconductor device of this embodiment is the same as that of the embodiment 2 except that MOSFET 41 is not necessary.

<Embodiment 4>

Figure 5:
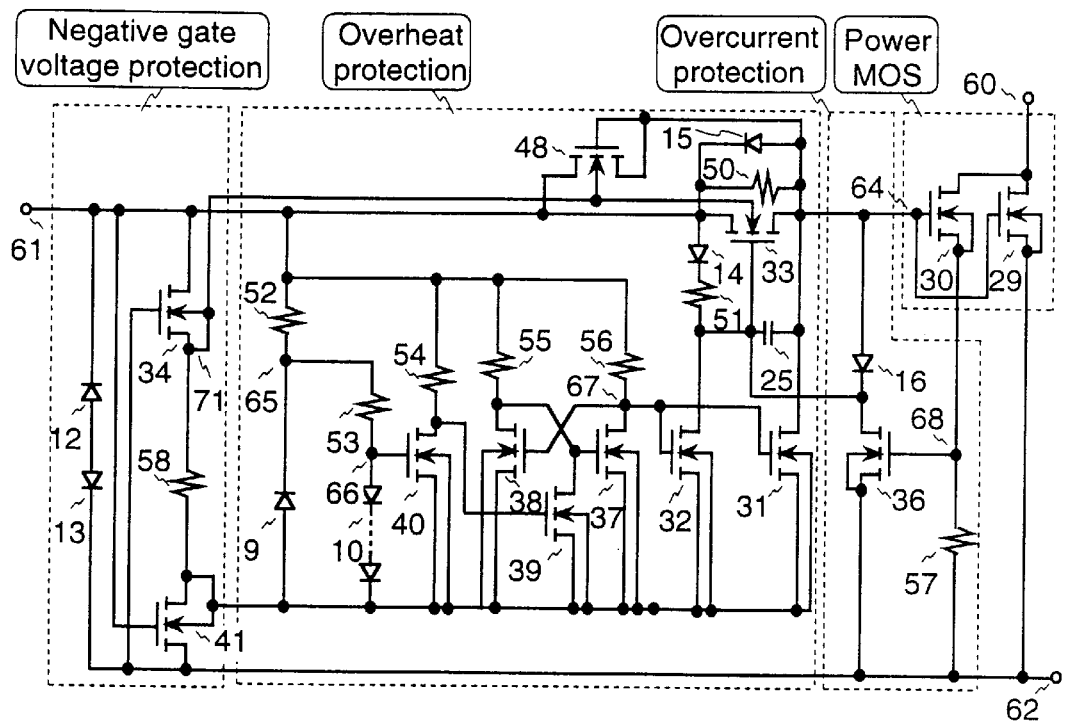
FIG. 5 is a circuit diagram illustrating the constitution of the semiconductor device according to a fourth embodiment of the present invention.

FIG. 5 is a circuit diagram illustrating the constitution of the semiconductor circuit device according to a fourth embodiment of the present invention. For the sake of explanation, here in FIG. 5, the same constituent portions as those of the embodiment 2 shown in FIG. 3 are denoted by the same reference numerals and their description is not repeated.

This embodiment is different from the embodiment 2 with respect to that the ground of the overheat protection circuit unit is not directly connected to the source terminal 62 but is connected to the body of MOSFET 41, and that the diodes 11 and 17 are omitted. The diodes 11 and 17 are omitted since it is made possible relying upon the MOSFET 41 to prevent the operation of the parasitic npn transistor which works with the drains of MOSFETs 31, 32, 37 to 40 as the emitter, the bodies thereof as the base, and the drain of the power MOSFET as the collector. In the case of the embodiment of FIG. 3, presence of the diode 11 makes it difficult to lower the gate voltage of power MOSFET 29 below about 0.5 V, and the drain current of power MOSFET is not sufficiently cut off under the overheated turn-off state. In the case of the embodiment 4, however, use of the MOSFET 41 having a low on-resistance makes it possible to reliably turn-off the power MOSFET.

Compared with the case of the embodiment of FIG. 3, furthermore, the voltage does not drop through the diode 17 so that there is improved the operation margin of the gate terminal voltage for normally operating the control circuit such as constant-voltage circuit and latch circuit.

When the MOSFET 41 is the depletione-type MOSFET, the source potentials of MOSFETs 31, 32, 37 to 40 can reach the voltage at the source terminal 62 even when the voltage at the gate terminal 61 is low. This makes it easy to improve the operation margin of the constant-voltage circuit and the latch circuit for the gate voltage.

In this embodiment, furthermore, the body and source of MOSFET 36 in the overcurrent protection circuit are not connected to the body of MOSFET 41 but are connected to the source terminal 62 like in the embodiment of FIG. 3 or FIG. 4. If the body and source of MOSFET 36 are connected to the body of MOSFET 41, there occurs a bad event that when a voltage is applied to the gate terminal 61 and immediately thereafter, the voltage across the drain and the source of the MOSFET 41 increases and prevents the MOSFET 36 from being turned on, so that the overcurrent protection circuit fails to properly operate.

In other respects, the constitution is quite the same as those shown in FIG. 3. Therefore, the circuit constitution for driving the power MOSFET 29 at a high frequency and the circuit constitution for negative gate voltage protection for preventing the operation of the parasitic npn transistor that occurs when the potential at the gate terminal 61 becomes lower than that of the source terminal 62, are the same as those of the embodiments 1 and 2 shown in FIGS. 1 and 3, and the same effects are obtained.

The semiconductor device according to this embodiment has the cross-sectional structure which is nearly the same as that of the embodiment 2. However, the bodies of MOSFETs 31, 32, 37 to 40 are isolated from the body region of the power MOSFET, and are formed in a body region (p-type diffusion layer 104*b*) connected to the body of MOSFET 41.

<Embodiment 5>

Figure 6:
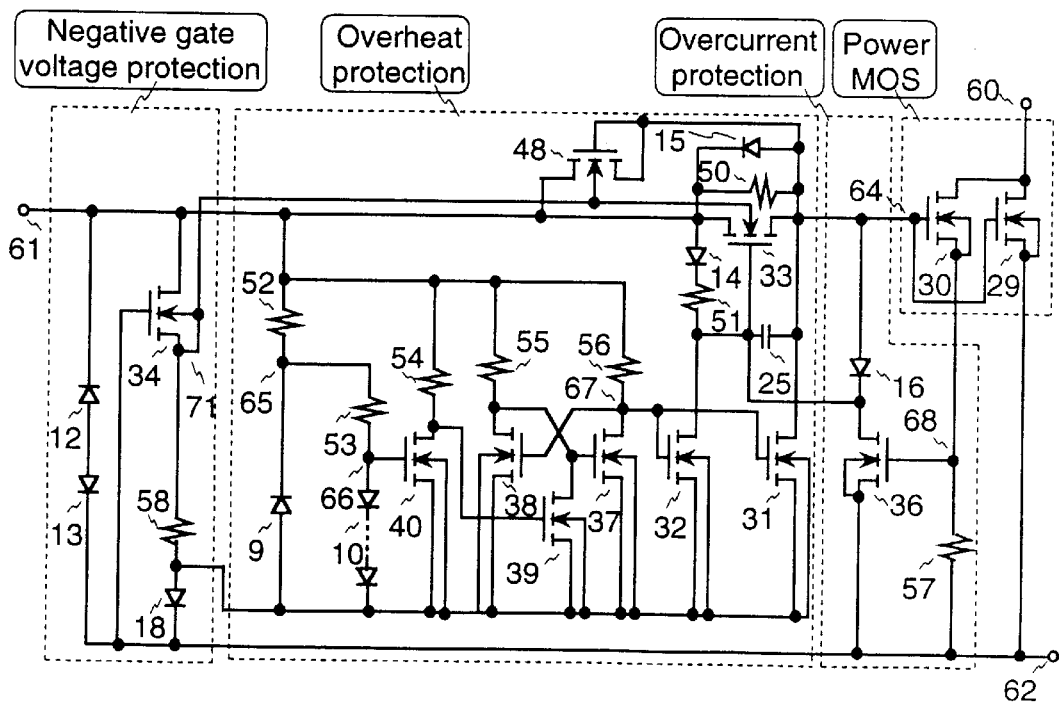
FIG. 6 is a circuit diagram illustrating the constitution of the semiconductor device according to a fifth embodiment of the present invention.

FIG. 6 is a circuit diagram illustrating the constitution of the semiconductor circuit device according to a fifth embodiment of the present invention. For the sake of explanation, here in FIG. 6, the same constituent portions as those of the embodiment 4 shown in FIG. 5 are denoted by the same reference numerals and their description is not repeated.

This embodiment is different from the embodiment 4 with respect to that a diode 18 is used instead of the MOSFET 41. Therefore, this embodiment does not help improve ability for turning off the power MOSFET at the time of overheat turn-off or does not help improve the operation margin for the gate terminal voltage that were obtained by the embodiment of FIG. 5. However, the improvement of this embodiment is that the circuit does not require the diodes 11, 17 for negative gate voltage protection, which were used in the embodiments of FIGS. 3 and 4. The actions and effects that are obtained are the same as those obtained by the embodiments of FIGS. 3 and 4.

The semiconductor device of this embodiment has a cross-sectional structure nearly the same as that of the embodiment 4. However, this embodiment does not have the MOSFET 41 shown in FIG. 5. Therefore the MOSFETs 31, 32, 37 to 40 are formed in a body region (p-type diffusion layer 104*b*).

<Embodiment 6>

Figure 7:
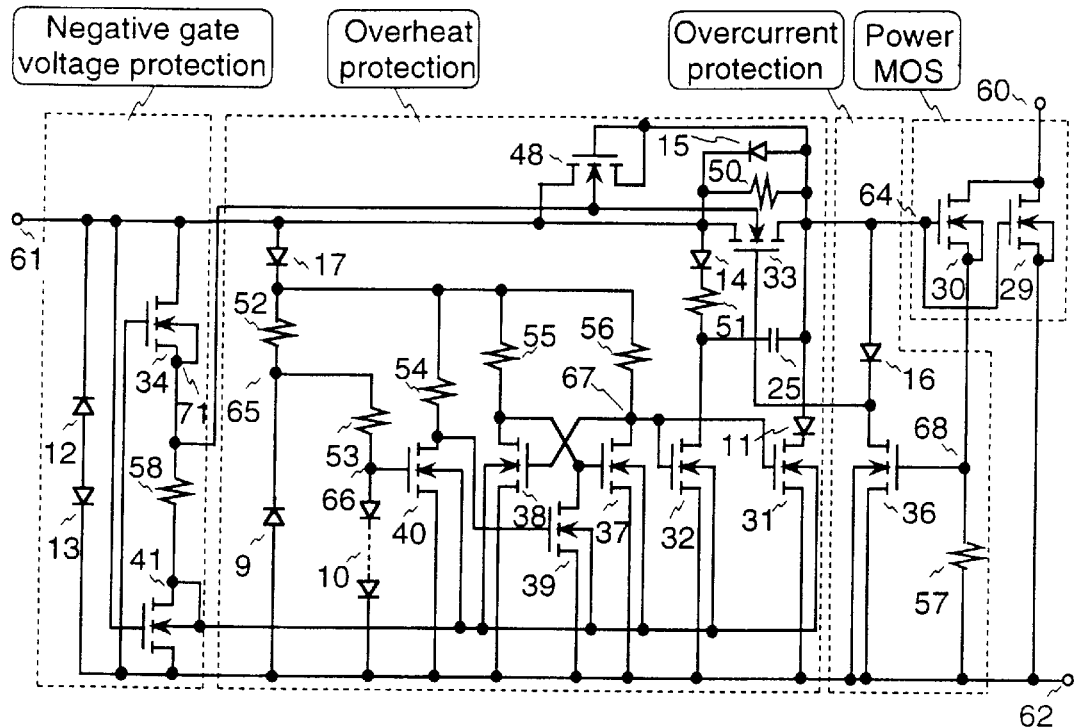
FIG. 7 is a circuit diagram illustrating the constitution of the semiconductor device according to a sixth embodiment of the present invention.

FIG. 7 is a circuit diagram illustrating the constitution of the semiconductor circuit device according to a sixth embodiment of the present invention. For the sake of explanation, here in FIG. 7, the same constituent portions as those of the embodiment 4 shown in FIG. 5 are denoted by the same reference numerals and their description is not repeated.

This embodiment is different from the embodiment 4 with respect to that the sources of MOSFETs 31, 32, 37 to 40, the diode 9, and the diode train 10 are connected to the source terminal 62, and that provision is made of diodes 11 and 17. When a positive gate voltage is applied, therefore, the MOSFET 41 is turned on, and the bodies and sources of MOSFETs 31, 32, 37 to 40 assume the same potential. In the case of this embodiment, even without the diodes 11 and 17, it is allowed to cut off the base current to the parasitic npn transistor that works with the drains of MOSFETs 31, 32, 37 to 40 as the emitter, the bodies of these MOSFETs as the base and the drain of power MOSFET as the collector. However, it is not allowed to cut off the collector current of the parasitic npn transistor. When the base current flows transiently to the parasitic npn transistor, therefore, a current may flow from the source terminal 62 to the gate terminal 61. The collector current may so work as to turn the parasitic npn transistor on. According to this embodiment, therefore, the diodes 11 and 17 prevent the collector current. In other respects, the actions and effects are the same as those of the embodiments shown in FIGS. 3 and 4.

The semiconductor device according to this embodiment has a cross-sectional structure which is nearly the same as that of the case of the embodiment 4 with the exception of difference in the manner of contacting the bodies and sources of MOSFETs 31, 32, 37 to 40.

<Embodiment 7>

Figure 8:
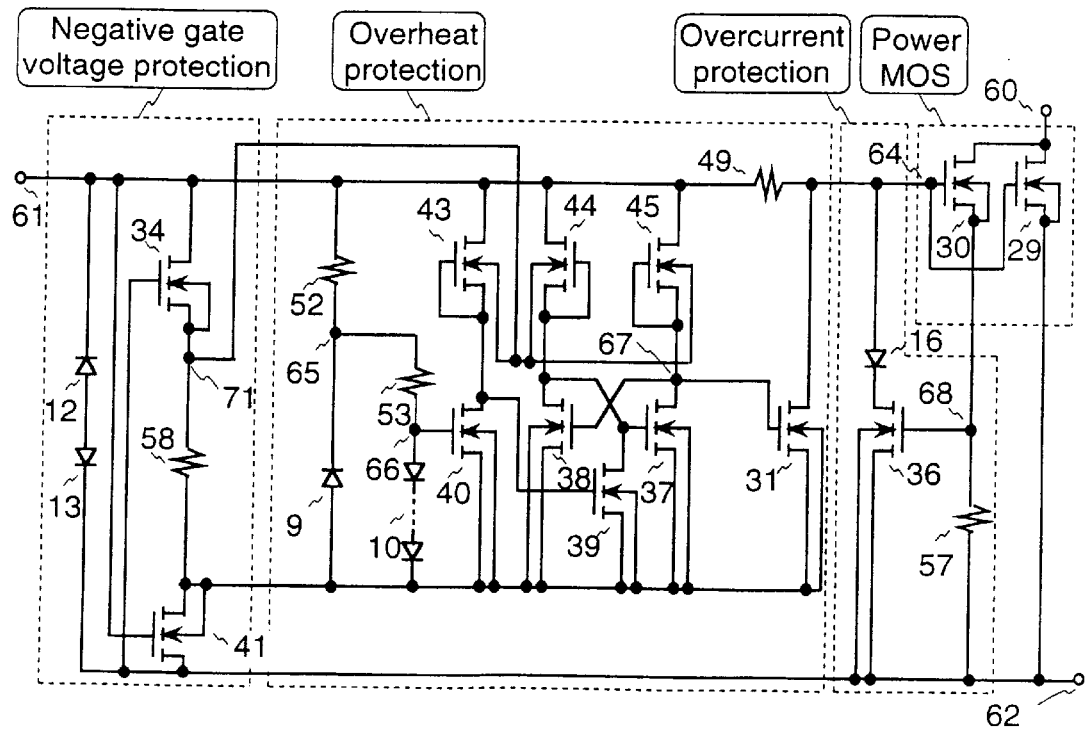
FIG. 8 is a circuit diagram illustrating the constitution of the semiconductor device according to a seventh embodiment of the present invention.

FIG. 8 is a circuit diagram illustrating the constitution of the semiconductor circuit device according to a seventh embodiment of the present invention. For the sake of explanation, here in FIG. 8, the same constituent portions as those of the embodiment 4 shown in FIG. 5 are denoted by the same reference numerals and their description is not repeated.

This embodiment is different from the embodiment 4 with respect to that the depletion-type MOSFETs 43 to 45 with their gates and source connected together are used as active loads instead of resistors 54 to 56 for the overheat protection circuit, that there is not used a drive circuit which comprises MOSFET 33, MOSFET 48 for driving the MOSFET 33, resistors 50, 51, diodes 14, 15 and capacitor 25, and that a resistor 49 is connected across the g ate 64 and the gate terminal 61. Here, the bodies of MOSFETs 43 to 45 are connected to the node 71.

This circuit can decrease the resistor areas. Moreover, by using MOSFETs 43 to 45 as active loads, this circuit, as compared with the case of using resistors 54 to 56, makes it possible to drive the device at high speeds when the driving power of the power MOSFET is constant or makes it possible to lower the driving power when the speed is constant. The resistor 49 is the one for lowering the potential at the gate 64 based upon the voltage drop as the current flows from the gate terminal 61 through the resistor 49 when the MOSFET 31 or the MOSFET 36 is turned on. This makes it possible to turn off the power MOSFET to effect overheat protection or to decrease the drain current of the power MOSFET to effect overcurrent protection.

The circuit of FIG. 8 has neither a MOSFET for driving the power MOSFET at high frequencies n or a drive circuit for the driving MOSFET. Though FIG. 8 does not have the MOSFET 33 which is used in the embodiments 1 to 6, FIG. 8 has a MOSFET of which neither the source nor the drain is connected to the source terminal 62 such as the MOSFETs 43 to 45 used as active loads. Therefore, the MOSFETs 43 to 45 require a negative gate voltage protection circuit similar to the one used for the MOSFET 33, i.e., require a negative gate voltage protection circuit constituted by MOSFETs 34 and 41.

The cross-sectional structure of the semiconductor device of this embodiment is the same as that of the case of the embodiment 4.

Moreover, the same functions and effects as those of this embodiment can be obtained even when the constitution in which the resistors 54 to 56 serve as loads mentioned in the embodiments of FIGS. 3 to 7 are replaced by the active loads 43 to 45.

In the foregoing were described preferred embodiments of the present invention. The present invention, however, is in no way limited to the aforementioned embodiments only. In the aforementioned embodiments, all MOSFETs inclusive of power MOSFETs were the n-channel MOSFETs. However, the same effects can be obtained even when all of the elements are the p-channel MOSFETs. The invention therefore can be modified in a variety of other ways without departing from the spirit and scope of the invention.

The foregoing embodiments have dealt with the insulated gate semiconductor devices containing a power MOSFET and its control circuit. However, in the case of the IGBT (insulated gate bipolar transistor) instead of the power MOSFET, a parasitic thyristor is formed instead of the parasitic npn transistor so that there is still a problem of a current leaks from the collector terminal of IGBT to the gate terminal. Quite in the same manner as the circuit and the device structure mentioned above, however, the operation of the parasitic element can be prevented when a negative gate voltage is applied, and the IGBT can be driven at a high frequency.

According to the present invention as will be obvious from the foregoing embodiments, it is made possible not to operate the parasitic npn transistor even when the control MOSFET of which neither the drain nor the source is connected to the source terminal is formed in the drain region of power MOSFET in order to operate the power MOSFET at high frequencies. Accordingly, no current is permitted to leak between the drain terminal and the gate terminal even when a negative gate voltage is applied like in the source-follower circuit.

It is further made possible to reliably turn off the power MOSFET and to increase the operation margin in the gate terminal voltage for normally operating the control circuit to become larger than that of the references.

While the present invention has been described in detail and pictorially in the accompanying drawings it is not limited to such details since many changes and modifications recognizable to those of ordinary skill in the art may be made to the invention without departing form the spirit and the scope thereof.

What is claimed is:

1. A semiconductor circuit device, which has a drain terminal, a gate terminal and a source terminal, formed on a semiconductor substrate, comprising:

a first insulated gate type transistor with its drain being connected to said drain terminal and its source being connected to said source terminal;

a first MOSFET whose source-drain path is provided between a gate of said first insulated gate type transistor and said gate terminal; and a second MOSFET with its body and source being connected to a body of said first MOSFET, its drain being connected to said gate terminal and its gate being connected to said source terminal.

2. A semiconductor circuit device, which has a drain terminal, a gate terminal, and a source terminal formed on a semiconductor substrate, comprising:

a first insulated gate type transistor with its drain being connected to said drain terminal and its source being connected to said source terminal;

a first MOSFET whose source-drain path is provided between a gate of said first insulated gate type transistor and said gate terminal; and a second MOSFET with its body and source being connected to a body of said first MOSFET, its drain being connected to said source terminal and its gate being connected to said gate terminal.

3. A semiconductor circuit device according to claim 2, further comprising a third MOSFET with its body and source being connected to a body of said second MOSFET and its drain being connected to the gate of said first insulated gate type transistor.

4. A semiconductor circuit device according to claim 2, further comprising a third MOSFET with its body and source being connected to the body of said first MOSFET, its drain being connected to said gate terminal and its gate being connected to said source terminal.

5. A semiconductor circuit device according to claim 4, further comprising:

a second insulated gate type transistor with its gate being coupled to the gate of said first insulated gate type transistor, its drain being connected to said drain terminal and its source being connected to said source terminal through a resistance;

a fourth MOSFET with its body and source being connected to said source terminal, its drain being connected to the gate of said first MOSFET and its gate being connected to a node between the source of said second insulated gate type transistor and said resistance.

6. A semiconductor circuit device according to claim 5, further comprising a diode connected between the drain of said fourth MOSFET and said gate terminal or the gate of said first insulated gate type transistor.

7. A semiconductor circuit device according to claim 2, further comprising a third MOSFET with its body being connected to the body of said second MOSFET, its drain being connected to the gate of said first insulated gate type transistor and its source being connected to said source terminal.

8. A semiconductor circuit device according to claim 7, further comprising a first diode connected between a drain of said third MOSFET and said gate terminal.

9. A semiconductor circuit device according to claim 8, further comprising a second diode connected between said gate terminal and said source terminal.

10. A semiconductor circuit device according to claim 9, further comprising a third diode connected between said gate terminal and said source terminal, said third diode being connected in series with, but in opposite direction to, said fourth diode.

11. A semiconductor circuit device according to claim 1, further comprising a resistor connected between the body of said first MOSFET and said source terminal.

12. A semiconductor circuit device according to claim 1, wherein said first MOSFET has its source connected to the gate of said first insulated gate type transistor and has its drain connected to said gate terminal.

13. A semiconductor circuit device according to claim 12, further comprising a diode connected between the gate of said first insulated gate type transistor and said gate terminal.

14. A semiconductor circuit device according to claim 12, further comprising a third MOSFET with its gate and drain being connected to the gate of said first insulated gate type transistor, its body being connected to the body of said first MOSFET and its source being connected to said gate terminal.

15. A semiconductor circuit device according to claim 12, further comprising a resistor connected between said gate terminal and the gate of said first insulated gate type transistor.

16. A semiconductor circuit device according to claim 12, further comprising:

a seventh resistor and a seventh diode series connected between the gate of the first MOSFET and said gate terminal; and a capacitor connected between the gate and the source of the first MOSFET.

17. A semiconductor circuit device according to claim 1, wherein said second MOSFET is of the depletion type.

18. A semiconductor circuit device according to claim 2, wherein said second MOSFET is of the depletion type.

19. A semiconductor circuit device according to any one of claims 1 to 2, wherein the body region of said first MOSFET and the body region of said first insulated gate type transistor are isolated by the drain region of said first insulated gate type transistor.

20. A semiconductor circuit device, which has a drain terminal, a gate terminal, and a source terminal formed on a semiconductor substrate, comprising:

a first insulated gate type transistor with its gate being connected to said gate terminal, its drain being connected to said drain terminal and its source being connected to said source terminal;

a first MOSFET with its drain being connected to said gate terminal; and a second MOSFET with its body and source being connected to a body of said first MOSFET, its drain being connected to said gate terminal and its gate being connected to said source terminal.

21. A semiconductor circuit device, which has a drain terminal, a gate terminal, and a source terminal on a semiconductor substrate, comprising:

a first insulated gate type transistor with its gate being connected to said gate terminal, its drain being connected to said drain terminal and its source being connected to said source terminal;

a first MOSFET with its drain being connected to said gate terminal; and a second MOSFET with its body and source being connected to the body of said first MOSFET, its drain being connected to said source terminal and its gate being connected to said gate terminal.

22. A semiconductor circuit device according to claim 21, further comprising a second MOSFET with its body and source being connected to the body of said first MOSFET, its drain being connected to said gate terminal and its gate being connected to said source terminal.

23. A semiconductor circuit device according to any one of claims 20 to 21, wherein the body region of said first MOSFET and the body region of said first insulated gate type transistor are isolated by the drain region of said first insulated gate type transistor.

24. A semiconductor circuit device according to claim 19, wherein the body of said first MOSFET contacts the drain region of said first insulated gate type transistor.

25. A semiconductor circuit device according to claim 23, wherein the body of said first MOSFET contacts the drain region of said first insulated gate type transistor.

26. A semiconductor circuit device having a substrate, a first region of a first conductivity type formed in said substrate, a second region of a second conductivity type contacted to said first region and a first MISFET formed in said second region, comprising:

switching means, operating when a first input voltage is inputted to a source or a drain of said first MISFET, for making said second region floating or for effecting a change in the potential difference between said second region with that of said source or drain.

27. A semiconductor circuit device according to claim 26, wherein said switching means includes a second MISFET with one of its source and drain being connected to one of the source and drain of said first MISFET to be inputted with said first input voltage, its body and the other one of the source and drain thereof being connected to the body of said first MISFET and its gate being connected to a first operating potential.

28. A semiconductor circuit device according to claim 26, wherein said switching means includes a second MISFET with its gate being connected to one of the source and drain of said first MISFET to be inputted with said first input voltage, its body and one of the source and drain thereof being connected to the body of said first MISFET and the other one of the source and drain being connected to a first operating potential.

29. A semiconductor circuit device according to claim 26, wherein said switching means has a diode between a body of said first MISFET and a first operating potential.

30. A semiconductor circuit device according to claim 27, wherein said switching means further includes a third MISFET with its gate being connected to that one of the source and drain of said first MISFET to be inputted with said first input voltage, its body and one of the source and drain thereof being connected to the body of said first MISFET and the other one of the source and drain being connected to the first operating potential.

31. A semiconductor circuit device according to claim 27, wherein said switching means has a diode between a body of said first MISFET and said first operating potential.

32. A semiconductor circuit device according to claim 30, further comprising a resistor connected between the body of said first MISFET and both the body and the said one of the source and drain of said third MISFET.

33. A semiconductor circuit device according to claim 32, further comprising a second resistor connected between the body of said first MISFET and said diode.

34. A semiconductor circuit device according to any one of claims 27, 28, 30 or 33, wherein said first region is connected to a second operating potential which prevents a current flow across a p-n junction between said second region and said first region when said second region is connected to said first operating potential.

35. A semiconductor circuit device according to claim 34, wherein said first conductivity type is n-type, said second conductivity type is p-type.

36. A semiconductor circuit device according to claim 1, wherein said first insulated gate type transistor is a MOSFET.

37. A semiconductor circuit device according to claim 2, wherein said first insulated gate type transistor is a MOSFET.

38. A semiconductor circuit device according to claim 20, wherein said first insulated gate type transistor is a MOSFET.

39. A semiconductor circuit device according to claim 21, wherein said first insulated gate type transistor is a MOSFET.

40. A semiconductor circuit device according to claim 1, wherein said first insulated gate type transistor is an IGBT.

41. A semiconductor circuit device according to claim 2, wherein said first insulated gate type transistor is an IGBT.

42. A semiconductor circuit device according to claim 20, wherein said first insulated gate type transistor is an IGBT.

43. A semiconductor circuit device according to claim 21, wherein said first insulated gate type transistor is an IGBT.

44. A semiconductor circuit device having a substrate, a first region of a first conductivity type formed in said substrate, a second region of a second conductivity type contacting said first region and a first MISFET formed in said second region, comprising:

switching means, operating when a first input voltage is inputted to a source or a drain of said first MISFET, for setting said second region into either a floating state condition or a connecting state, wherein a difference between a potential voltage at the second region and the potential voltage at the source or drain of said first MISFET is a first voltage under the floating state, and the difference between a potential voltage at the second region and the potential voltage at the source or drain is a second voltage under the connecting state, the first voltage being larger than the second voltage.

* * * * *